United States Patent
Fan

(10) Patent No.: US 12,439,690 B2
(45) Date of Patent: Oct. 7, 2025

(54) DISPLAY PANEL, SPLICING SCREEN, DISPLAY DEVICE, AND METHOD FOR MANUFACTURING DISPLAY PANEL

(71) Applicants: Huizhou China Star Optoelectronics Display Co., Ltd., Guangdong (CN); TCL China Star Optoelectronics Technology Co., Ltd., Guangdong (CN)

(72) Inventor: Yongping Fan, Guangdong (CN)

(73) Assignees: Huizhou China Star Optoelectronics Display Co., Ltd., Huizhou (CN); TCL China Star Ogtoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/772,667

(22) PCT Filed: Mar. 15, 2022

(86) PCT No.: PCT/CN2022/080899
§ 371 (c)(1),
(2) Date: Apr. 28, 2022

(87) PCT Pub. No.: WO2023/151151
PCT Pub. Date: Aug. 17, 2023

(65) Prior Publication Data
US 2024/0170494 A1 May 23, 2024

(30) Foreign Application Priority Data
Feb. 14, 2022 (CN) .......................... 202210132796.0

(51) Int. Cl.
*H10K 59/123* (2023.01)
*H01L 25/16* (2023.01)
(Continued)

(52) U.S. Cl.
CPC .......... *H10D 86/60* (2025.01); *H01L 25/167* (2013.01); *H10D 86/441* (2025.01)

(58) Field of Classification Search
CPC .. H10K 59/127; H10K 59/123; H10K 59/131; H10K 59/179; H01L 27/124
See application file for complete search history.

(56) References Cited

U.S. PATENT DOCUMENTS 11,710,762 B2 *  7/2023  Kim .................... H01L 25/0753
                                                     257/72
11,765,940 B2 *  9/2023  Song ...................... G09G 3/035
                                                     345/691
(Continued)

FOREIGN PATENT DOCUMENTS

CN      101494011      7/2009
CN      105204261      12/2015
(Continued)

*Primary Examiner* — Eduardo A Rodela

(57) ABSTRACT

The present application provides a display panel, a splicing screen, a display device, and a method for manufacturing the display panel, and relates to a display technology field. In the display panel provided by the present application, a plurality of light-emitting units are mainly arranged in an array on a surface of the display panel corresponding to a frame area so as to visually weaken or eliminate an influence of the frame area on a display effect of the display panel. At a same time, the present application also utilizes a driving circuit layer in an array substrate in the display panel to directly drive the light-emitting units, which simplifies a structure and a driving method of the display panel and is especially suitable for a splicing screen using the display panel as a unit screen.

14 Claims, 5 Drawing Sheets

(51) Int. Cl.
  *H10D 86/40*  (2025.01)
  *H10D 86/60*  (2025.01)
  *H10K 59/125*  (2023.01)

(56) References Cited

U.S. PATENT DOCUMENTS

| | | |
|---|---|---|
| 2017/0242309 A1 | 8/2017 | Doi et al. |
| 2018/0074367 A1 | 3/2018 | Miyawaki et al. |
| 2018/0196190 A1 | 7/2018 | Takase |
| 2022/0216276 A1* | 7/2022 | Lee ...................... H10K 59/122 |
| 2022/0231258 A1* | 7/2022 | Cho ...................... H10K 50/844 |
| 2022/0246711 A1* | 8/2022 | Zhang ................ H10K 59/1216 |
| 2023/0020926 A1* | 1/2023 | Park ........................ H01L 33/62 |

FOREIGN PATENT DOCUMENTS

| | | |
|---|---|---|
| CN | 207199233 | 4/2018 |
| CN | 108205970 | 6/2018 |
| CN | 111863897 | 10/2020 |
| CN | 112420790 | 2/2021 |
| CN | 113703211 | 11/2021 |
| CN | 113703219 | 11/2021 |
| CN | 113990209 | 1/2022 |
| CN | 114005411 | 2/2022 |
| WO | WO 2020/224389 | 11/2020 |

* cited by examiner

DISPLAY PANEL, SPLICING SCREEN, DISPLAY DEVICE, AND METHOD FOR MANUFACTURING DISPLAY PANEL

RELATED APPLICATIONS

This application is a National Phase of PCT Patent Application No. PCT/CN2022/080899 having International filing date of Mar. 15, 2022, which claims the benefit of priority of Chinese Patent Application No. 202210132796.0 filed on Feb. 14, 2022. The contents of the above applications are all incorporated by reference as if fully set forth herein in their entirety.

FIELD AND BACKGROUND OF THE INVENTION

The present application relates to the technical field of display, and especially to a display panel, a splicing screen, a display device, and a method for manufacturing the display panel.

With development of electronic display products, consumers increasingly pursue visual sense of products. In a conventional display panel, due to technical limitations, a frame area is inevitably formed outside of a display area, and existence of the frame area limits development of corresponding electronic products. For example, in a single display screen field, the frame area reduces a visual screen-to-body ratio of a display. For another example, in a splicing screen field, a splicing gap formed by frames between unit screens will affect a visual effect of displayed images.

SUMMARY OF THE INVENTION

A technical problem to be solved by the present application is: provide a display panel which can improve an influence of a frame area on a display effect of the display panel.

A technical solution adopted by the present application for solving above technical problems is:

in a first aspect, the present application provides a display panel, the display panel includes a display area and a frame area, the frame area surrounds the display area; the display panel includes an array substrate, a plurality of light-emitting units, and a plurality of driving lines electrically connected to the light-emitting units; the plurality of light-emitting units are arranged in an array on a surface of the display panel corresponding to the frame area so as to at least partially cover a surface of the frame area of the display panel; the array substrate includes a driving circuit layer, at least part of the driving lines electrically connect with the driving circuit layer so that the drive circuit layer drives the light-emitting units.

Optionally, in some embodiments of the present application, the array substrate is disposed on a light-emitting side of the display panel, the array substrate further includes a base substrate, and the driving circuit layer and the base substrate are sequentially stacked along light-emitting direction. The light-emitting units and the driving lines are arranged on a light-emitting surface of the base substrate. The base substrate is defined with via holes extending from the light-emitting surface to the driving circuit layer and further includes connection lines passing through the via holes. At least part of the driving lines electrically connect with the driving circuit layer through the connection lines.

Optionally, in some embodiments of the present application, the plurality of the driving lines include a plurality of light-emitting unit scan lines extending in parallel and a plurality of light-emitting unit data lines extending in parallel. The plurality of the light-emitting unit scan lines and the plurality of the light-emitting unit data lines are cross-arranged to form first pixel areas corresponding to the light-emitting units.

Optionally, in some embodiments of the present application, a plurality of pixel scan lines extending in parallel and a plurality of pixel data lines extending in parallel are formed in a portion of the driving circuit layer corresponding to the display area. The plurality of pixel scan lines and the plurality of pixel data lines are cross-arranged to form second pixel area corresponding to a sub pixel unit;

wherein, the plurality of light-emitting unit scan lines at least include first scan lines electrically connected to the pixel scan lines in a one-to-one correspondence with each other. The plurality of light-emitting unit data lines at least include first scan lines electrically connected to the pixel data lines in a one-to-one correspondence with each other.

Optionally, in some embodiments of the present application, all the pixel scan lines electrically connect with the corresponding first scan lines, all the pixel data lines electrically connect with the corresponding first data lines.

Optionally, in some embodiments of the present application, projections of the first scan lines and projections of the pixel scan lines electrically connected with the first scan lines extend in a same direction in a same plane perpendicular to a positive direction. Projections of the first data lines and projections of the pixel data lines electrically connected with the first data lines extend in a same direction in a same plane perpendicular to the positive direction.

Optionally, in some embodiments of the present application, the pixel scan lines and the pixel data lines extend into a portion of the driving circuit layer corresponding to the frame area.

Optionally, in some embodiments of the present application, the projections of the first scan lines and the projections of the pixel scan lines electrically connected to the corresponding pixel scan lines at least partially overlap in the same plane perpendicular to the positive direction. The projections of the first data lines and the projections of the pixel data lines electrically connected to the corresponding pixel data lines at least partially overlap in the same plane perpendicular to the positive direction.

Optionally, in some embodiments of the present application, the light-emitting unit scan lines and the pixel scan lines are electrically connected to a same gate driving circuit of the display panel. The light-emitting unit data lines and the pixel data lines are electrically connected to a same data driving circuit of the display panel.

Optionally, in some embodiments of the present application, projections of the first pixel areas and projections of the second pixel areas are arranged in an array in the positive direction.

Optionally, in some embodiments of the present application, the plurality of driving lines also include anode lines and cathode lines. The light-emitting unit includes a switching thin film transistor, a driving thin film transistor, and a light-emitting diode. A source electrode of the switching thin film transistor electrically connects with the light-emitting unit data line, a gate electrode of the switching thin film transistor electrically connects with the light-emitting unit scan line, and a drain electrode of the switching thin film transistor electrically connects with a gate electrode of the driving thin film transistor. A source electrode of the driving thin film transistor electrically connects with the anode line, a drain electrode of the driving thin film transistor electrically connects with an anode of the light-emitting diode, and the cathode line electrically connects with a cathode of the light-emitting diode. Through arrangement of the above thin film transistors, the driving lines can effectively realize to drive the light-emitting diode units.

In a second aspect, the present application provides a splicing screen, which includes the plurality of display panels according to the first aspect, the frame areas of the plurality of display panels are spliced with each other.

In a third aspect, the present application provides a display device, which includes the display panels according to the first aspect, or includes the splicing screen according to the second aspect.

In a fourth aspect, the present application provides a method for manufacturing a display panel, which includes:
providing a display panel, the display panel having a display area and a frame area, the frame area surrounding the display area, the display panel including an array substrate with a driving circuit layer;
arranging a plurality of light-emitting units in an array on a surface of the display panel corresponding to the frame area, the light-emitting units being electrically connected to the driving circuit layer through driving lines.

Optionally, in some embodiments of the present application, the array substrate is disposed on a light-emitting side of the display panel, the providing the display panel includes:
providing a base substrate, the base substrate having a light-emitting surface and a light receiving surface opposite to each other;
forming the driving lines on the light-emitting surface of the base substrate corresponding to the frame area;
punching holes on the base substrate to form via holes extending from the light-emitting surface to the light receiving surface, arranging connection lines connected to the driving lines in the via holes;
making the driving circuit layer on the light receiving surface of the base substrate so that the driving circuit layer connects to the connection lines.

Comparing with the prior art, the present application has following advantages:
the present application provides the display panel, the plurality of light-emitting units are mainly arranged in the array on the surface of the display panel corresponding to the frame area; while the display area of the display panel is displaying normally, the light-emitting units arranged in the array can also be displayed synchronously so as to visually weaken or eliminate an influence of the frame area on display effect of the display panel and increase visual screen-to-body ratio; at the same time, the present application also utilizes the driving circuit layer in the array substrate in the display panel to directly drive the light-emitting units, which simplifies a structure and driving method of the display panel, and is especially suitable for a splicing screen using the display panel as a unit screen.

BRIEF DESCRIPTION OF THE SEVERAL VIEWS OF THE DRAWINGS

In order to more clearly illustrate the embodiments of the present application or the technical solutions in the prior art, the following briefly introduces accompanying the drawings that need to be used in the embodiments. The drawings in the following description are only part of the embodiments of the present application. For those of ordinary skill in the art, other drawings can also be obtained according to these drawings without creative efforts.

Figure 1:
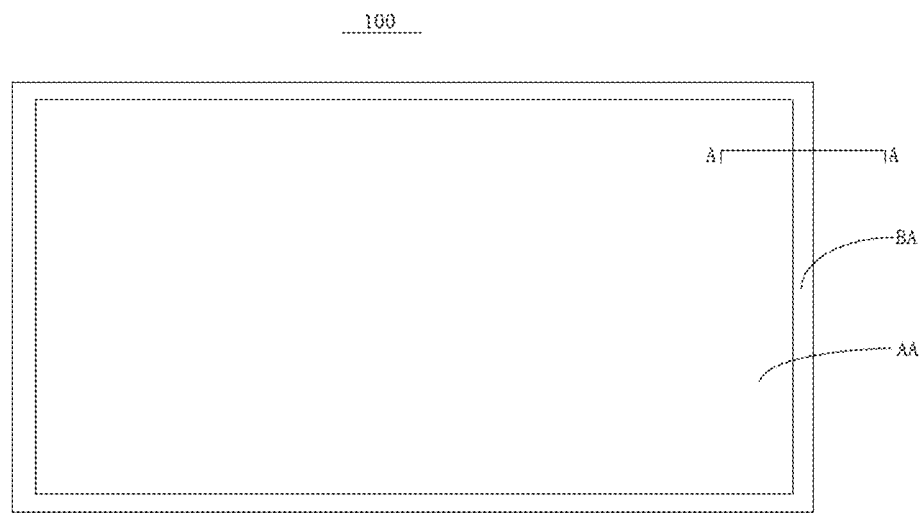
FIG. 1 is a schematic structural diagram of a display panel in an embodiment 1 provided by the present application.

Reference numbers in drawings:
100—display panel; display area—AA; frame area—BA;
110—driving line, 111—light-emitting unit scan line, 111a—first scan line, 111b—second scan line,
112—light-emitting unit data line, 112a—first data line, 112b—second data line, 113—anode line,
114—cathode line, 115—first pixel area;
120—array substrate, 121—base substrate; 122—driving circuit layer, 1221—pixel scan line, 1222—pixel data line, 123—via hole, 124—connection line, 125—second pixel area;
130—liquid crystal layer;
140—opposite substrate;
150—light-emitting unit, 151—switching thin film transistor, 152—driving thin film transistor, 153—light-emitting diode;
160—backlight module;
200—splicing screen.

DESCRIPTION OF SPECIFIC EMBODIMENTS OF THE INVENTION

The technical solutions in the embodiments of the present application will be clearly and completely described below with reference to the drawings in the embodiments of the present application. Obviously, the described embodiments are only a part of the embodiments of the present application, rather than all the embodiments. Based on the embodiments in the present application, all other embodiments obtained by those skilled in the art without creative work fall within the protection scope of the present application.

In the description herein, it should be understood that the terms, such as "center," "longitudinal," "lateral," "length," "width," "thickness," "upper," "lower," "front," "rear," "left," "right," "vertical," "horizontal," "top," "bottom," "inside," "outside," "clockwise," and "counterclockwise,"

instruct the relationship of orientation or position based on the orientation or positional relationship shown in the accompanying drawings, it is only for the convenience of describing the present application and simplifying the description, rather than indicating or implying that the referred device or element has a specific orientation or is constructed and operated in a specific orientation. Therefore, it should not be construed as a limitation of the present application. In the description herein, it should be understood that the terms such as "first" and "second" are only used for descriptive purposes and cannot be interpreted as indicating or implying relative importance or implicitly indicating the number of indicated technical features. Thus, features defined as "first" and "second" may expressly or implicitly include one or more of said features. In the description of the present application, "plurality" means two or more, unless otherwise expressly and specifically defined.

In this disclosure, the word "exemplary" is used to mean "serving as an example, illustration, or illustration." Any embodiment described in the present application as "exemplary" is not necessarily to be construed as preferred or advantageous over other embodiments. The following description is presented to enable any person skilled in the art to make and use the present application. In the following description, details are set forth for the purpose of explanation. It is to be understood that one of ordinary skill in the art can realize that the present application may be practiced without the use of these specific details. In other instances, well-known structures and procedures have not been described in detail so as not to obscure the description of the present application with unnecessary detail. Thus, the present application is not intended to be limited to the embodiments shown, but is to be accorded the widest scope consistent with the principles disclosed herein.

Embodiment 1

Figure 2:
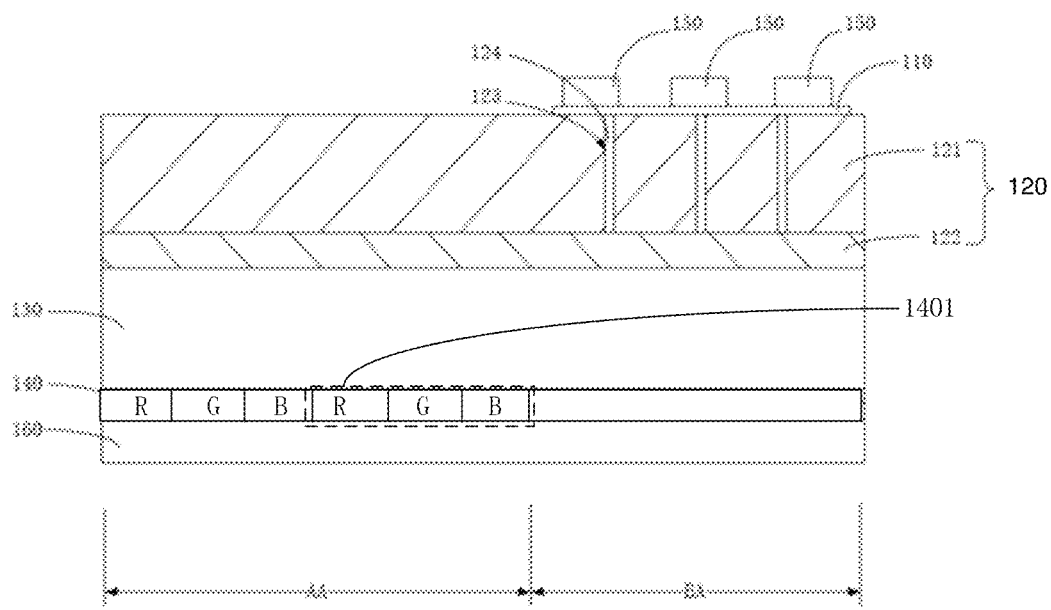
FIG. 2 is a sectional schematic diagram at a A-A place in FIG. 1.

Please refer to FIG. 1 and FIG. 2, a main subject of the present embodiment is a display panel 100, the display panel 100 has a display area AA and a frame area BA, and the frame area BA surrounds the display area AA;

wherein, the display panel 100 further includes a plurality of light-emitting units 150 which are arranged in an array on a surface of the display panel 100 corresponding to the frame area BA to at least partially cover a surface of the frame area BA of the display panel 100.

In detail, the display panel 100 here refers to a panel structure for displaying images to users, which may be a single display screen or a unit screen as a part of a splicing screen 200. The display area AA correspondingly refers to a part of the display panel 100 used for displaying images. Meanwhile, the frame area BA correspondingly refers to a frame part of the display panel 100. The light-emitting units 150 mainly refer to a structure capable of spontaneously emitting light, which can display an image after array is arranged, which may be LED chips as shown in the present embodiment.

In the display panel 100 provided in the present embodiment, the plurality of light-emitting units 150 are mainly arranged in the array on the surface of the display panel 100 corresponding to the frame area BA. While the display area AA of the display panel 100 is displaying normally, the light-emitting units 150 arranged in the array can also be displayed synchronously so as to visually weaken or eliminate an influence of the frame area BA on a display effect of the display panel 100 and increase a visual screen-to-body ratio.

It can be understood that, for the above display panel 100, it can be any one of an LED display panel or an LCD display panel, and the implementer can choose correspondingly according to their own needs. In the present embodiment, the above display panel 100 is an LCD display panel. Specifically, the display panel 100 includes a opposite substrate 140, a liquid crystal layer 130, and an array substrate 120 stacked in sequence. The opposite substrate 140 referred to here may be a color filter substrate as shown in the present embodiment.

At a same time, for the above light-emitting units 150, the implementer can additionally set up a driving circuit for independently driving each light-emitting unit 150. But obviously, such setting will increase structural complexity of the display panel 100 and increase manufacturing cost of the display panel 100. Correspondingly, please refer to FIG. 2 again, in the present embodiment, the display panel 100 further includes a plurality of driving lines 110 for driving the light-emitting units 150, and at least part of the plurality of driving lines 110 electrically connect with the array substrate 120 so that array substrate 120 drives the light-emitting units 150. The driving lines 110 are mainly used to control the light-emitting units 150 or provide power to the light-emitting units 150. In the present embodiment, the driving lines 110 connect with the array substrate 120 so that the array substrate 120 normally drives sub-pixel units 1401 in the display area AA and simultaneously drives each light-emitting unit 150. It is prevented that a separate driving circuit for driving the light-emitting units 150 is additionally disposed for the display panel 100 and the complexity of the structure is reduced. As shown in FIG. 2, the above sub-pixel units 1401 are disposed on the opposite substrate 140 using as the color filter.

In addition, regarding connection method between the driving lines 110 and the array substrate 120, in another embodiment, the opposite substrate 140 constitutes a light-emitting surface of the display panel 100, that is, the light-emitting units 150 and the corresponding driving lines 110 are disposed on the light-emitting surface of the opposite substrate 140. At this time, the implementer only needs to set connection lines 124 extending from the light-emitting surface of the opposite substrate 140 to the array substrate 120 through the opposite substrate 140 and a plastic frame of the liquid crystal layer 130 so that the array substrate 120 realizes an electrical connection with the driving lines 110. For above technical solution, via holes 123 need to pass through a plurality of components, which is complicated in a manufacturing process.

Corresponding to this, in the present embodiment, the array substrate 120 includes a driving circuit layer 122 and a base substrate 121 which are sequentially stacked along a light-emitting direction. The light-emitting units 150 are arranged on the light-emitting surface of the base substrate 121. The base substrate 121 is defined with via holes 123 extending from the light-emitting surface thereof to the driving circuit layer 122 and also includes the connection lines 124 passing through the via holes 123. At least part of the driving lines 110 connect with the driving circuit layer 122 through the connection lines 124.

That is to say, in the present embodiment, the backlight module 160, the opposite substrate 140, the liquid crystal layer 130, and the array substrate 120 are sequentially stacked along the light-emitting direction so that the light-emitting surface of the base substrate 121 in the array substrate 120 forms a part of the surface of the display panel 100. At this time, the implementer only needs to set the base substrate 121 to be a double-sided process and perform a punching process on the light-emitting surface of the base substrate 121 to form via holes 123 extending from the light-emitting surface of the base substrate 121 to a light receiving surface of the base substrate 121, and then the connection lines 124 are arranged in the via holes 123. After the driving circuit layer 122 is formed on the light receiving surface of the base substrate 121, the electrical connection between the driving lines 110 and the driving circuit layer 122 in the array substrate 120 can be realized. Comparing with the previous solution, the present embodiment effectively reduces a structure and process complexity of the via holes 123 and is suitable for mass production. In addition, the base substrate 121 described above may be any one of a plastic substrate or a glass substrate, in the present embodiment, the glass substrate is used as the base substrate 121.

Figure 3:
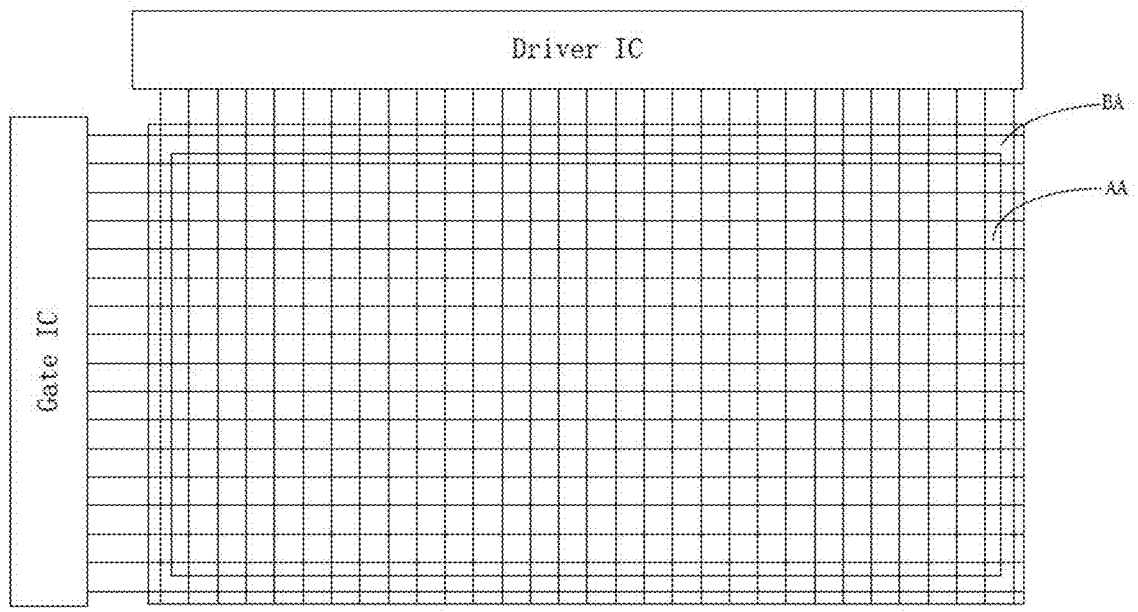
FIG. 3 is a schematic diagram of arrangement of scan lines and data lines on the display panel in the embodiment 1 provided by the present application.
Figure 4:
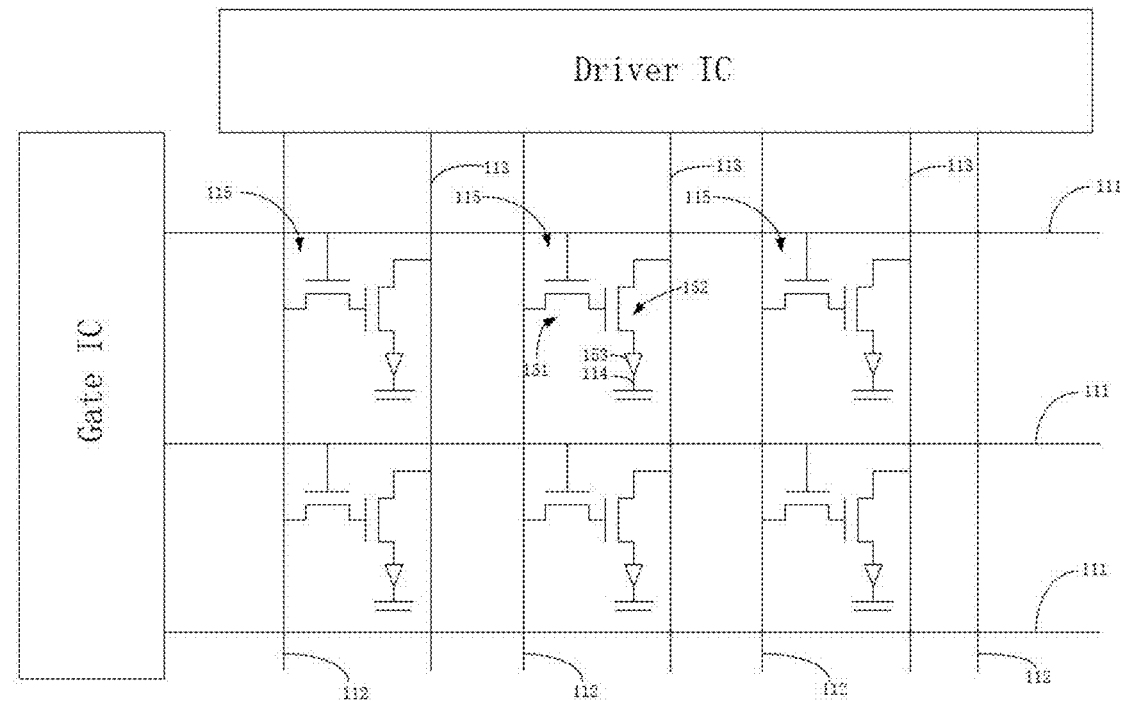
FIG. 4 is a schematic diagram of arrangement of a plurality of light-emitting units in the embodiment 1 provided by the present application.

For the driving lines 110, please refer to FIG. 4, it is similar to a driving method of the light-emitting unit 150 in a conventional method. In the present embodiment, the plurality of driving lines 110 are disposed on the base substrate 121. The plurality of the driving lines 110 include a plurality of light-emitting unit scan lines 111 extending in parallel and a plurality of light-emitting unit data lines 112 extending in parallel. The plurality of light-emitting unit scan lines 111 and the plurality of light-emitting unit data lines 112 are cross-arranged to form first pixel areas 115 corresponding to the light-emitting units 150. The first pixel areas 115 mentioned here refer to areas where the light-emitting units 150 are correspondingly placed, and the first pixel areas 115 are arranged in an array so that each light-emitting unit 150 can realize pixel display. At a same time, please refer to FIG. 3 and FIG. 5, a plurality of pixel scan lines 1221 extending in parallel and a plurality of pixel data lines 1222 extending in parallel are formed in a portion of the driving circuit layer 122 corresponding to the display area AA. The plurality of pixel scan lines 1221 and the plurality of pixel data lines 1222 are cross-arranged to form second pixel areas 125 corresponding to the sub pixel units.

Figure 5:
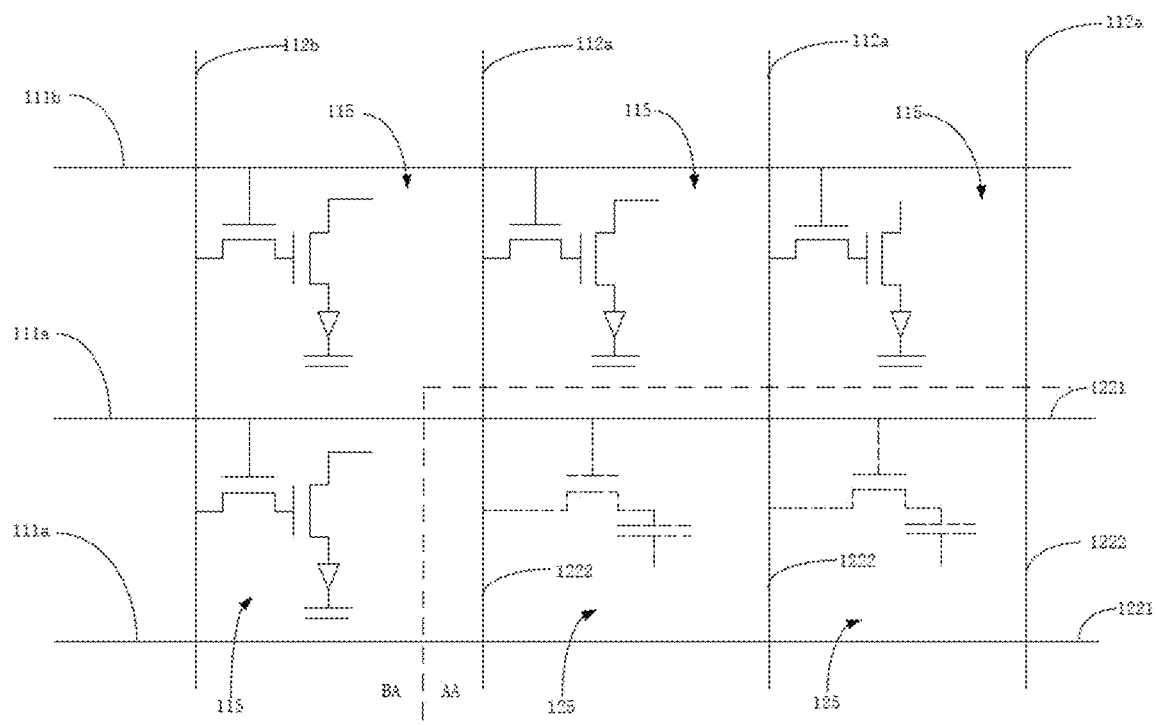
FIG. 5 is a schematic projection diagram of a first pixel area and a second pixel area in a same plane perpendicular to a positive direction in the embodiment 1 provided by the present application.

Please refer to FIG. 5, the plurality of light-emitting unit scan lines 111 at least include first scan lines 111a electrically connected to the pixel scan lines 1221 in a one-to-one correspondence with each other. The plurality of light-emitting unit data lines 112 at least include first data lines 112a electrically connected to the pixel data lines 1222 in a one-to-one correspondence with each other. That is to say, in the technical solution provided by the present embodiment, the light-emitting unit scan lines 111 and the light-emitting unit data lines 112 in the driving lines 110 utilize the existing pixel scan lines 1221 and the pixel data lines 1222 in the display panel 100. The first scan lines 111a and the pixel scan lines 1221 together share scan signals sent by a gate driving circuit in the display panel 100. The first data lines 112a and the pixel data lines 1222 together share data signals sent by a data driving circuit in the display panel 100, thereby preventing additionally disposing driving circuits for separately driving the light-emitting units 150 and reducing complexity of the circuits.

It should be noted here that, in the present embodiment, all the pixel scan lines 1221 electrically connect with the corresponding first scan lines 111a, and all the pixel data lines 1222 electrically connect with the corresponding first data lines 112a. However, this should not be construed as a limitation on the first scan lines 111a and the pixel scan lines 1221 correspondingly and electrically connected with the first scan lines 111a and as a limitation on the first data lines 112a and the pixel data lines 1222 correspondingly and electrically connected with first data lines 112a. The implementer can set only part of the pixel scan lines 1221 to be electrically connected to the corresponding first scan lines 111a or part of the pixel data lines 1222 to be electrically connected to the corresponding first data lines 112a, which is not specifically limited in this application.

Regarding the first scan lines 111a and the pixel scan lines 1221 correspondingly and electrically connected to the first scan lines 111, the first data lines 112a and the pixel data lines 1222 correspondingly and electrically connected to first data lines 112a, the two electrically connected scan lines and the two data lines may be staggered from each other, but this arrangement obviously increases complexity of arrangement of the via holes 123, which is difficult to achieve in terms of technology. Corresponding to this, please refer to FIG. 5 again, in the present embodiment, projections of the first scan lines 111a and projections of the pixel scan lines 1221 correspondingly and electrically connected with the first scan lines extend in a same direction in a same plane perpendicular to a positive direction. Projections of the first data lines 112a and projections of the pixel data lines 1222 correspondingly and electrically connected with the first data lines extend in a same direction in a same plane perpendicular to the positive direction. This arrangement can reduce structural complexity of the via holes 123 and facilitate manufacture of the via holes 123.

Please refer to FIG. 3 and FIG. 5 in combination, it can be understood that, in order to realize normal driving of the light-emitting units 150, the light-emitting unit scan line 111 not only includes the first scan line 111a as described above, but also includes a second scan line 111b that a straight line in which an extending direction thereof is located does not pass through the display area AA. Same for the light-emitting unit data line 112, the light-emitting unit data line 112 not only includes the first data line 112a as described above, but also includes a second data line 112b that a straight line in which an extending direction thereof is located does not pass through the display area AA.

Regarding the second scan line 111b and the second data line 112b, the implementer can set up a driving circuit independent of the gate driving circuit and the data driving circuit described above for driving. In the present embodiment, the light-emitting unit scan lines 111 including the first scan lines 111a and the second scan lines 111b and the pixel scan lines 1221 electrically connect with a same gate driving circuit of the display panel 100. The light-emitting unit data lines 112 including the first data lines 112a and the second data lines 112b and the pixel data lines 1222 electrically connect with a same data driving circuit of the display panel 100, thereby further preventing additionally disposing a driving circuit for driving the light-emitting units 150 separately.

Figure 6:
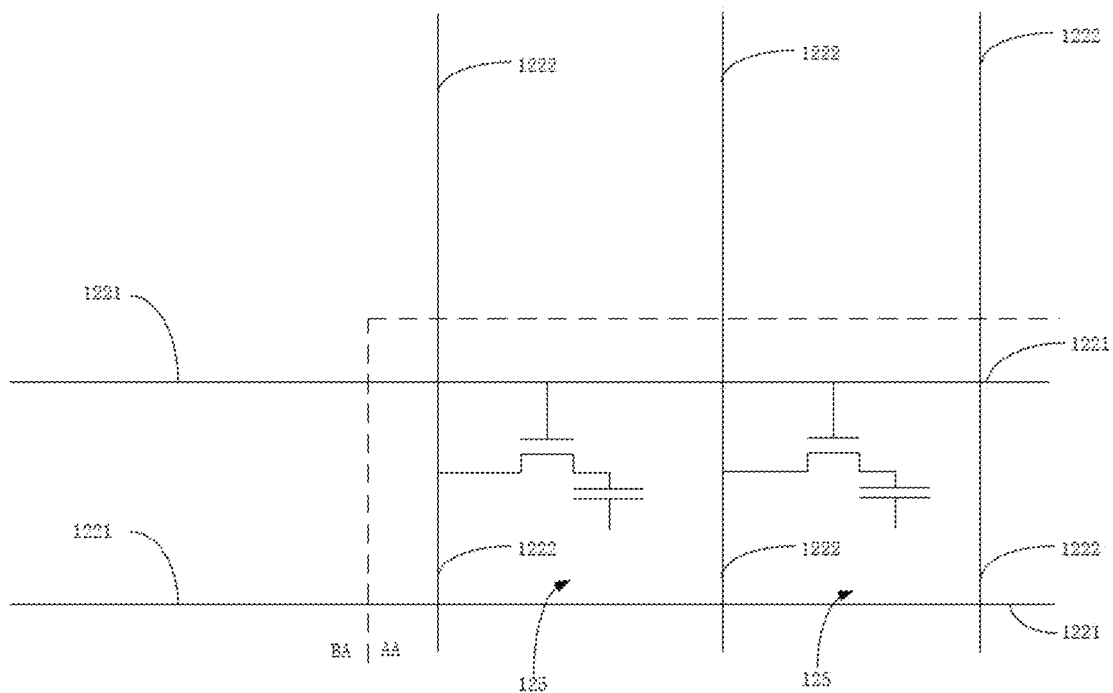
FIG. 6 is an extension schematic diagram of a plurality of pixel scan lines and a plurality of pixel data lines in the embodiment 1 provided by the present application.

Further, regarding the pixel scan lines 1221 and the pixel data lines 1222 described above, in a conventional way, the pixel scan lines 1221 and the pixel data lines 1222 are arranged in the display area AA of the display panel 100, and the pixel scan lines 1221 and the pixel data lines 1222 will be cut off when they extend to the frame area BA of the display panel 100. If the pixel scan lines 1221 and the pixel data lines 1222 are cut off when they extend to the frame area BA of the display panel 100, the via holes 123 and the connection lines 124 need to be disposed in bent shapes, so that corresponding electrical connections can be formed between the scan lines and the data lines. This will increase the structural complexity of the via holes 123, and regarding this, please refer to FIG. 6. In the present embodiment, the pixel scan lines 1221 and the pixel data lines 1222 extend to the portion of the driving circuit layer 122 corresponding to the frame area BA. In this way, the implementer only needs to punch holes and arrange the connection lines 124 in the positive direction, i.e., perpendicular to the light-emitting surface of the base substrate 121 or substantially perpendicular to the light-emitting surface of the base substrate 121, and the corresponding electrical connection between the scan lines and the data lines can be realized and the via holes 123 are easier to realize in terms of processes and structures. Wherein, an ideal setting way is: the projections of the first scan lines 111a and the projections of the pixel scan lines 1221 correspondingly and electrically connected to the corresponding pixel scan lines 111a at least partially overlap or completely overlap in the same plane perpendicular to the positive direction. The projections of the first data lines 112a and the projections of the pixel data lines 1222 correspondingly and electrically connected to the corresponding pixel data lines 112a at least partially overlap or completely overlap in the same plane perpendicular to the positive direction. In this way, it is only necessary to define the via holes 123 extending perpendicular to the base substrate 121 and the connection lines 124 at an overlapping portion of the scan lines and an overlapping portion of the data lines, so that the electrical connection of the corresponding scan lines can be realized and the electrical connection of the corresponding data lines can be realized.

Regarding the first pixel areas 115 and the second pixel areas 125 as described above, each of the first pixel areas 115 may be arranged in an array, and each of the second pixel areas 125 may be arranged in an array. In the same plane perpendicular to positive direction, projections of the first pixel areas 115 and projections of the second pixel areas 125 are arranged in a staggered arrangement or partially overlapped or in different sizes or all of the above styles. However, in such a way, at a junction between the display area AA and the frame area BA, a situation that the display screen is not continuous easily occurs. Therefore, referring to FIG. 5, in the present embodiment, the projections of the first pixel areas 115 and the projections of the second pixel regions 125 in the same plane perpendicular to the positive direction are arranged in an array for further improving the display effect of the display panel 100. In addition, the light-emitting unit 150 may, as shown in the present embodiment, include a first light-emitting unit correspondingly emitting blue light, a second light-emitting unit correspondingly emitting green light, and a third light-emitting unit correspondingly emitting red light, and other ways may also be used, which is not particularly limited in this application.

For driving the light-emitting units 150 by the driving lines 110, please refer to FIG. 4, in the present embodiment, the plurality of driving lines 110 also include anode lines 113 and cathode lines 114. The light-emitting unit 150 includes a switching thin film transistor 151, a driving thin film transistor 152, and a light-emitting diode 153. A source electrode of the switching thin film transistor 151 electrically connects with the light-emitting unit data line 112, a gate electrode of the switching thin film transistor 151 electrically connects with the light-emitting unit scan line 111, and a drain electrode of the switching thin film transistor 151 electrically connects with a gate electrode of the driving thin film transistor 152. A source electrode of the driving thin film transistor 152 electrically connects with the anode line 113, a drain electrode of the driving thin film transistor 152 electrically connects with an anode of the light-emitting diode 153, and the cathode line 114 electrically connects with a cathode of the light-emitting diode 153. Wherein, the anode lines 113 and the cathode lines 114 electrically connect with the driving circuit layer 122 through the via holes 123 and the connection lines 124, that is, the driving circuit layer 122 provides voltages for the light-emitting units 150. More specifically, referring to FIG. 5, in the present embodiment, the above mentioned anode lines 113 also connect with the data driving circuit in the display panel 100, so that the data driving circuit provides voltages for the light-emitting units 150. Of course, on the premise that the object of the invention is not affected, the implementer can also select above mentioned manner of supplying voltages to the light-emitting units 150, which is not particularly limited in the present application.

In addition, in the related technical solutions, some technical means for driving the sub-pixel units 1401 (e.g., each including a red sub-pixel, a green sub-pixel, and a blue sub pixel) for the pixel scan lines 1221 and the pixel data lines 1222 have been disclosed, and therefore, in the present embodiment, the manner by which the pixel scan lines 1221 and the pixel data lines 1222 drive the sub-pixel units will not be described repeatedly.

Figure 7:
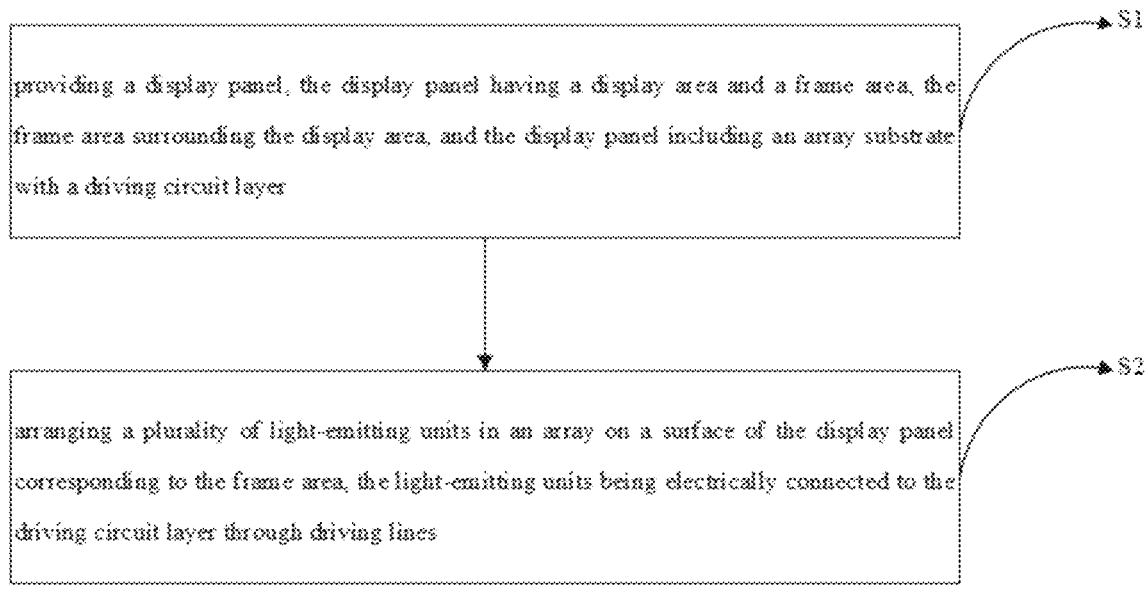
FIG. 7 is a schematic flowchart of a manufacturing method of the embodiment 1 provided by the present application.

Referring to FIG. 7, the present embodiment also provides a method for manufacturing a display panel 100 as described above, including:

S1, providing the display panel 100, the display panel 100 having a display area AA and a frame area BA, the frame area BA surrounding the display area AA, and the display panel 100 including an array substrate 120 with a driving circuit layer 122;

S2, arranging a plurality of light-emitting units 150 in an array on a surface of the display panel 100 corresponding to the frame area BA, the light-emitting units 150 being electrically connected to the driving circuit layer 122 through driving lines 110.

Figure 8:
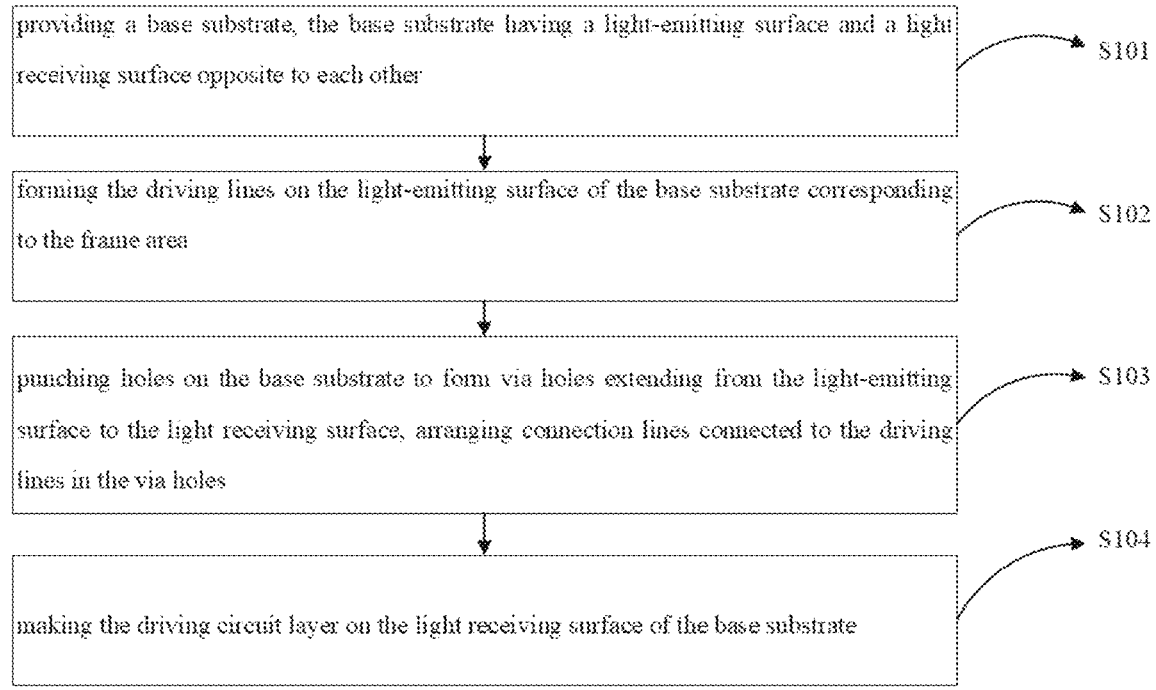
FIG. 8 is a schematic flowchart of refinement steps of the manufacturing method of the embodiment 1 provided by the present application.

More specifically, in the present embodiment, because the array substrate 120 is disposed on a light-emitting side of the display panel 100, please refer to FIG. 8; regarding step S1, in the present embodiment, providing a display panel 100 specifically includes:

S101, providing a base substrate 121, the base substrate 121 having a light-emitting surface and a light receiving surface arranged opposite to each other;

S102, forming the driving lines 110 on the light-emitting surface of the base substrate 121 corresponding to the frame area BA;

S103, punching holes on the base substrate 121 to form via holes 123 extending from the light-emitting surface to the light receiving surface, and arranging connection lines 124 connected to the driving lines 110 in the via holes 123;

S104, making the driving circuit layer 122 on the light receiving surface of the base substrate 121 so that the driving circuit layer 122 connects to the connection lines 124.

In the method provided in the present embodiment, the connection between the driving lines 110 and the driving circuit layer 122 is realized through a double-sided process of the base substrate 121, and process reliability is stronger. In addition, it should be noted that the process used in the present embodiment is to first manufacture the driving lines 110 and then manufacture the driving circuit layer 122. The implementer may also first manufacture the driving circuit layer 122 and then manufacture the driving lines 110, which is not specifically limited in the present application.

Embodiment 2

A main subject of embodiment 2 is a display panel 100. The embodiment 2 is roughly same as the embodiment 1, and main differences between the embodiment 1 and the embodiment 2 are:

in the present embodiment, the pixel scan lines 1221 and the pixel data lines 1222 in the driving circuit layer 122 extend into the frame area BA, and the second pixel area 125 formed by the cross-arrangement of the pixel scan lines 1221 and the pixel data lines 1222 in the frame area BA overlap with the light-emitting units 150 arranged in the array correspondingly. At a same time, the driving lines 110 on the light-emitting surface of the base substrate 121 are no longer arranged in a manner of the light-emitting unit scan lines 111 and the light-emitting unit data lines 112. The light-emitting units 150 electrically connect with the pixel scan lines 1221 and the pixel data lines 1222 located in the frame area BA and disposed in the driving circuit layer 122 through the connection lines 124, so that the driving circuit layer 122 directly drives the light-emitting units 150.

It should be noted that, because the light-emitting units 150 are disposed on the light-emitting surface of the base substrate 121, and the connection lines 124 are formed in the via holes inside of the base substrate 121, and therefore, some signal lines are still formed on the light-emitting surface between the light-emitting units 150 and the connection lines 124 to realize signal transmission; the signal lines constitute the driving lines 110.

Embodiment 3

Figure 9:
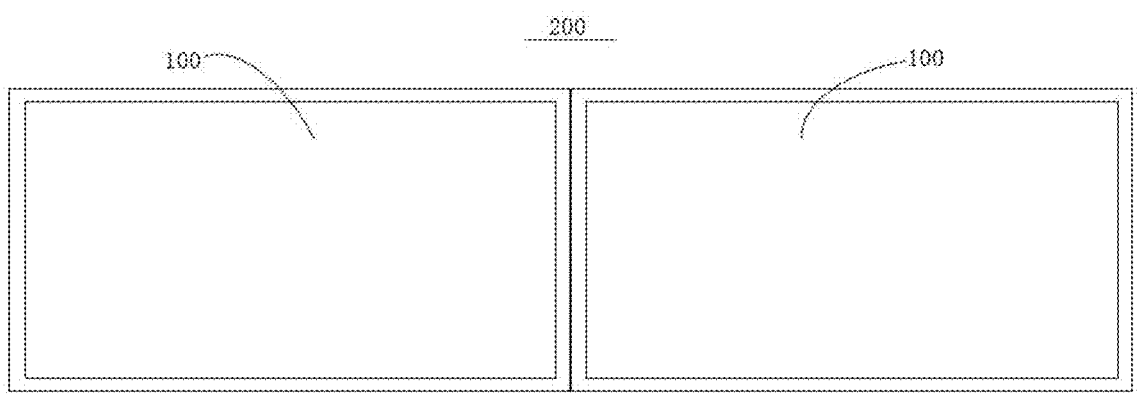
FIG. 9 is a schematic structural diagram of a splicing screen in an embodiment 3 provided by the present application.

Referring to FIG. 9, a main subject of embodiment 3 is a splicing screen 200, which is mainly composed of a plurality of unit screens. The unit screen is the display panel 100 provided in the embodiment 1 or the embodiment 2. A plurality of frame areas BA are spliced with each other. Wherein, because the frame area BA of the display panel 100 is covered by the light-emitting units 150, the frame area BA is visually weakened or eliminated.

In addition, it can be understood that a number of the above mentioned unit screens may be two, three, four, etc., which is not particularly limited in the present application. In addition, splicing of the above mentioned unit screens is not limited to the two unit screens shown in the present embodiment splicing in parallel to each other, so that the two frame areas BA are flush. Splicing of the above unit screens may also be two unit screens are spliced at a certain angle.

Embodiment 4

A main subject of embodiment 4 is a display device, and it includes the display panel 100 described in the embodiment 1 or the embodiment 2, or includes the splicing screen 200 described in the embodiment 3. The display device provided in the present embodiment can be any display devices with a display panel 100, such as a tablet, a mobile phone, a computer monitor, a VR device, etc. The implementer can choose correspondingly according to their own needs, and the present application does not make special restrictions.

The basic concept has been described above. Obviously, for those skilled in the art, the above detailed disclosure is only an example, and does not constitute a limitation to the present application. Although not explicitly described here, various modifications, improvements, and corrections to the present application may occur to those skilled in the art. Such modifications, improvements, and corrections are suggested in this disclosure, so such modifications, improvements, and corrections still fall within the spirit and scope of the exemplary embodiments of this disclosure.

Meanwhile, the present application uses specific words to describe the embodiments of the present application. For example, "one embodiment," "an embodiment," and/or "some embodiments" mean(s) a certain feature, structure, or characteristic associated with at least one embodiment of the present application. Therefore, it should be emphasized and noted that two or more references to "an embodiment" or "one embodiment" or "an alternative embodiment" in various places in this specification are not necessarily referring to the same embodiment. Furthermore, certain features, structures, or characteristics of the one or more embodiments of the present application may be combined as appropriate.

Similarly, it should be noted that, in order to simplify the expressions disclosed in the present application and thereby help the understanding of one or more embodiments of the disclosure, in the foregoing description of the embodiments of the present application, various features are sometimes combined into one embodiment, in the drawings or descriptions thereof. However, this method of disclosure does not imply that the subject matter of the disclosure requires more features than those mentioned in the claims. Indeed, there are fewer features of an embodiment than all of the features of a single embodiment disclosed above.

Some examples use numbers to describe quantities of ingredients and attributes, it should be understood that such numbers used to describe the examples, and in some examples, the modifiers "about", "approximately" or "substantially" are used to retouch. Unless stated otherwise, "about", "approximately" or "substantially" means that a variation of ±% is allowed for a number. Accordingly, in some embodiments, the numerical parameters set forth in the specification and claims are approximations that can vary depending upon the desired characteristics of individual embodiments. In some embodiments, the numerical parameters should take into account the specified significant digits and use a general digit reservation method. Notwithstanding that the numerical fields and parameters used in some embodiments of the present application to confirm the breadth of their ranges are approximations, in particular embodiments such numerical values are set as precisely as practicable.

For each patent, patent disclosure, patent disclosure publication, and other material, such as articles, books, specifications, publications, documents, etc., cited in the present application, the entire contents of which are hereby incorporated by reference are hereby incorporated by reference into the present application, but not in parallel with the content of the present application. Except for inconsistent or conflicting disclosure history documents, documents (currently or hereafter appended to the present application) limiting the broadest scope of the claims of the present application are also excluded. It should be noted that, if there is any inconsistency or conflict between the descriptions, definitions, and/or use of terms in the attached materials of the present application and the content of the present application, the descriptions, definitions and/or use of terms in the present application shall prevail.

What is claimed is:

1. A display panel, the display panel comprising a display area and a frame area, and the frame area surrounding the display area; and the display panel being a liquid crystal display panel;

wherein the display panel comprises an array substrate, a plurality of light-emitting units, a plurality of driving lines electrically connected to the light-emitting units, and a opposite substrate; the plurality of light-emitting units are arranged in an array on a surface of the display panel corresponding to the frame area so as to at least partially cover a surface of the frame area of the display panel; a portion of the opposite substrate corresponding to the display area is arranged with sub-pixel units; the array substrate comprises a driving circuit layer, and at least part of the driving lines electrically connect with the driving circuit layer so that the drive circuit layer drives the light-emitting units while the drive circuit layer drives the sub-pixel units;

wherein the array substrate is disposed on a light-emitting side of the display panel; the array substrate further includes a base substrate, and the driving circuit layer and the base substrate are sequentially stacked along a light-emitting direction; the light-emitting units and the driving lines are arranged on a light-emitting surface of the base substrate; each of the driving lines is arranged with ones of the plurality of light-emitting units thereon; a portion of the base substrate which is at the frame area is defined with via holes extending from the light-emitting surface to the driving circuit layer and further comprises connection lines passing through the via holes; and at least part of the driving lines electrically connect with the driving circuit layer through the connection lines which are arranged one-to-one corresponding to the ones of the plurality of light-emitting units.

2. The display panel as claimed in claim 1, wherein the plurality of driving lines include a plurality of light-emitting unit scan lines extending in parallel and a plurality of light-emitting unit data lines extending in parallel; and the plurality of light-emitting unit scan lines and the plurality of light-emitting unit data lines are cross-arranged to form first pixel areas corresponding to the light-emitting units.

3. The display panel as claimed in claim 2, wherein a plurality of pixel scan lines extending in parallel and a plurality of pixel data lines extending in parallel are formed in a portion of the driving circuit layer corresponding to the display area; the plurality of pixel scan lines and the plurality of pixel data lines are cross-arranged to form second pixel areas corresponding to the sub-pixel units;

wherein, the plurality of light-emitting unit scan lines at least include first scan lines electrically connected to the pixel scan lines in a one-to-one correspondence with each other; and the plurality of light-emitting unit data lines at least include first datalines electrically connected to the pixel data lines in a one-to-one correspondence with each other.

4. The display panel as claimed in claim 3, wherein all the pixel scan lines electrically connect with the corresponding first scan lines.

5. The display panel as claimed in claim 3, wherein all the pixel data lines electrically connect with the corresponding first data lines.

6. The display panel as claimed in claim 3, wherein projections of the first scan lines and projections of the pixel scan lines correspondingly and electrically connected with the first scan lines extend in a same direction in a same plane perpendicular to a positive direction; projections of the first data lines and projections of the pixel data lines correspondingly and electrically connected with the first data lines extend in a same direction in a same plane perpendicular to the positive direction.

7. The display panel as claimed in claim 6, wherein the pixel scan lines and the pixel data lines extend into a portion of the driving circuit layer corresponding to the frame area.

8. The display panel as claimed in claim 7, wherein the projections of the first scan lines and the projections of the pixel scan lines correspondingly and electrically connected to the first scan lines at least partially overlap in the same plane perpendicular to the positive direction.

9. The display panel as claimed in claim 7, wherein the projections of the first data lines and the projections of the pixel data lines correspondingly and electrically connected to the first data lines at least partially overlap in the same plane perpendicular to the positive direction.

10. The display panel as claimed in claim 3, wherein the light-emitting unit scan lines and the pixel scan lines are electrically connected to a same gate driving circuit of the display panel.

11. The display panel as claimed in claim 3, wherein the light-emitting unit data lines and the pixel data lines are electrically connected to a same data driving circuit of the display panel.

12. The display panel as claimed in claim 3, wherein projections of the first pixel areas and projections of the second pixel areas are arranged in an array in a same plane perpendicular to the positive direction.

13. The display panel as claimed in claim 2, wherein the plurality of driving lines also include anode lines and cathode lines; the light-emitting unit includes a switching thin film transistor, a driving thin film transistor, and a light-emitting diode; a source electrode of the switching thin film transistor electrically connects with the light-emitting unit data lines, a gate electrode of the switching thin film transistor electrically connects with the light-emitting unit scan lines, and a drain electrode of the switching thin film transistor electrically connects with a gate electrode of the driving thin film transistor; a source electrode of the driving thin film transistor electrically connects with the anode line, a drain electrode of the driving thin film transistor electrically connects with an anode of the light-emitting diode, and the cathode line electrically connect with a cathode of the light-emitting diode.

14. A display device, comprising a display panel, the display panel comprising a display area and a frame area, and the frame area surrounding the display area; and the display panel being a liquid crystal display panel;

wherein the display panel comprises an array substrate, a plurality of light-emitting units, a plurality of driving lines electrically connected to the light-emitting units, and a opposite substrate; the plurality of light-emitting units are arranged in an array on a surface of the display panel corresponding to the frame area so as to at least partially cover a surface of the frame area of the display panel; a portion of the opposite substrate corresponding to the display area is arranged with sub-pixel units; the array substrate comprises a driving circuit layer, and at least part of the driving lines electrically connect with the driving circuit layer so that the drive circuit layer drives the light-emitting units while the drive circuit layer drives the sub-pixel units;

wherein the array substrate is disposed on a light-emitting side of the display panel; the array substrate further includes a base substrate, and the driving circuit layer and the base substrate are sequentially stacked along a light-emitting direction; the light-emitting units and the driving lines are arranged on a light-emitting surface of the base substrate; each of the driving lines is arranged with ones of the plurality of light-emitting units thereon; a portion of the base substrate which is at the frame area is defined with via holes extending from the light-emitting surface to the driving circuit layer and further comprises connection lines passing through the via holes; and at least part of the driving lines electrically connect with the driving circuit layer through the connection lines which are arranged one-to-one corresponding to the ones of the plurality of light-emitting units.

\* \* \* \* \*

UNITED STATES PATENT AND TRADEMARK OFFICE
CERTIFICATE OF CORRECTION

| | | |
|---|---|---|
| PATENT NO. | : 12,439,690 B2 | Page 1 of 1 |
| APPLICATION NO. | : 17/772667 | |
| DATED | : October 7, 2025 | |
| INVENTOR(S) | : Yongping Fan | |

It is certified that error appears in the above-identified patent and that said Letters Patent is hereby corrected as shown below:

On the Title Page

Item (73) Assignee, Line 3:
"Ogtoelectronics" should be changed to -- Optoelectronics --

Signed and Sealed this
Third Day of February, 2026

John A. Squires
*Director of the United States Patent and Trademark Office*